(12) United States Patent
Sheng et al.

(10) Patent No.: US 11,866,821 B2
(45) Date of Patent: Jan. 9, 2024

(54) SUBSTRATE SUPPORT COVER FOR HIGH-TEMPERATURE CORROSIVE ENVIRONMENT

(71) Applicant: Applied Materials, Inc., Santa Clara, CA (US)

(72) Inventors: Shuran Sheng, Saratoga, CA (US); Lin Zhang, San Jose, CA (US); Jiyong Huang, Rockwall, TX (US); Joseph C. Werner, Santa Clara, CA (US); Stanley Wu, San Ramon, CA (US); Mahesh Adinath Kanawade, Santa Clara, CA (US); Yikai Chen, San Jose, CA (US); Yixing Lin, Saratoga, CA (US); Ying Ma, Castro Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 376 days.

(21) Appl. No.: 16/806,656

(22) Filed: Mar. 2, 2020

(65) Prior Publication Data

US 2020/0370174 A1 Nov. 26, 2020

Related U.S. Application Data

(60) Provisional application No. 62/851,461, filed on May 22, 2019.

(51) Int. Cl.
*C23C 16/44* (2006.01)
*C01F 17/265* (2020.01)
(Continued)

(52) U.S. Cl.
CPC ........ *C23C 16/4404* (2013.01); *C01F 17/265* (2020.01); *C23C 16/4405* (2013.01);
(Continued)

(58) Field of Classification Search
CPC ............ C23C 16/4404; C23C 16/4405; C23C 16/4581; C23C 16/4585; C01F 17/265; C01F 17/218; C01F 17/229
See application file for complete search history.

(56) References Cited

U.S. PATENT DOCUMENTS 5,589,003 A 12/1996 Zhao et al.
5,680,013 A * 10/1997 Dornfest ........... H01J 37/32495
315/111.21

(Continued)

FOREIGN PATENT DOCUMENTS

CN 105190847 A 12/2015
CN 107287545 A 10/2017
(Continued)

OTHER PUBLICATIONS

How to convert the coefficient of thermal expansion; studybuff. com/what-is-thermal-expansion-coefficient-of-steel/ (Year: 2022).*
(Continued)

*Primary Examiner* — Jeffrie R Lund
(74) *Attorney, Agent, or Firm* — Patterson + Sheridan, LLP

(57) ABSTRACT

Embodiments of the present disclosure generally relate to an apparatus and a method for cleaning a processing chamber. In one embodiment, a substrate support cover includes a bulk member coated with a fluoride coating. The substrate support cover is placed on a substrate support disposed in the processing chamber during a cleaning process. The fluoride coating does not react with the cleaning species. The substrate support cover protects the substrate support from reacting with the cleaning species, leading to reduced condensation formed on chamber components, which in turn leads to reduced contamination of the substrate in subsequent processes.

10 Claims, 8 Drawing Sheets

(51) Int. Cl.
*C23C 16/458* (2006.01)
*C01F 17/229* (2020.01)
*C01F 17/218* (2020.01)

(52) U.S. Cl.
CPC ...... *C23C 16/4581* (2013.01); *C23C 16/4585* (2013.01); *C01F 17/218* (2020.01); *C01F 17/229* (2020.01)

(56) References Cited

U.S. PATENT DOCUMENTS

| | | | |
|---|---|---|---|
| 5,810,937 | A | 9/1998 | Gupta et al. |
| 6,768,581 | B1 * | 7/2004 | Yip .................. G02B 27/0012 428/421 |
| 8,252,410 | B2 | 8/2012 | Rasheed |
| 9,850,573 | B1 * | 12/2017 | Sun .................. C23C 16/45525 |
| 10,190,701 | B2 | 1/2019 | Raj et al. |
| 2002/0006724 | A1 | 1/2002 | Shiota et al. |
| 2012/0107996 | A1 | 5/2012 | Sheng et al. |
| 2015/0218700 | A1 * | 8/2015 | Nguyen .................. C23C 16/56 427/255.39 |
| 2015/0333213 | A1 | 11/2015 | Sheng et al. |
| 2017/0040146 | A1 | 2/2017 | Huang et al. |
| 2017/0204516 | A1 * | 7/2017 | Nguyen .................. C23C 16/40 |
| 2017/0260616 | A1 * | 9/2017 | Lee .......................... C23C 4/04 |
| 2017/0323772 | A1 * | 11/2017 | Fenwick ............. C23C 14/0694 |
| 2018/0105701 | A1 | 4/2018 | Larsson et al. |
| 2018/0350572 | A1 * | 12/2018 | Wu ....................... H01J 37/3411 |
| 2019/0080889 | A1 * | 3/2019 | Ghosh ............... H01J 37/32495 |
| 2019/0264314 | A1 | 8/2019 | Gopalan et al. |
| 2020/0185203 | A1 * | 6/2020 | Lubomirsky ......... C23C 16/405 |
| 2020/0370174 | A1 * | 11/2020 | Sheng .................. C01F 17/265 |
| 2021/0343557 | A1 * | 11/2021 | Rasheed ........... H01L 21/68735 |
| 2022/0275504 | A1 * | 9/2022 | Shanbhag ........... C23C 16/4405 |
| 2022/0344135 | A1 * | 10/2022 | Sheng ............... H01J 37/32862 |
| 2023/0069395 | A1 * | 3/2023 | Hassan ............. H01J 37/32724 |

FOREIGN PATENT DOCUMENTS

| | | | | | |
|---|---|---|---|---|---|
| JP | H-04191379 | A | | 7/1992 | |
| JP | H09-270388 | A | | 10/1997 | |
| JP | H10-284475 | A | | 10/1998 | |
| JP | 2007-533848 | A | | 11/2007 | |
| KR | 100299487 | B1 | | 10/2001 | |
| TW | I484052 | B | * | 5/2015 | |
| TW | 201817915 | A | | 5/2018 | |
| TW | 202147508 | A | * | 12/2021 | ....... H01L 21/67103 |
| WO | WO-0031569 | A1 | * | 6/2000 | ............... G02B 1/10 |
| WO | 2005103327 | A1 | | 11/2005 | |
| WO | WO-2012118446 | A1 | * | 9/2012 | ............. H01M 4/13 |
| WO | 2013130179 | A2 | | 9/2013 | |

OTHER PUBLICATIONS

List of Thermal Expansion Coefficients (CTE) for Natural and Engineered Materials; www.msesupplies.com/pages/list-of-thermal-expansion-coefficients-cte-for-natural-and-engineered-materials (Year: 2022).*
Linear Thermal Expansion Coefficient of Aluminum Alloys; https://amesweb.info/Materials/Thermal_Expansion_Coefficient_of_Aluminum.aspx (Year: 1998).*
Lanthanum Fluoride (LaF3); http://www.ultiquestcom.com/products/optics/lanthanum-fluoride-laf3.html (Year: 1999).*
Magnesium Fluoride (MgF2); http://www.ultiquestcom.com/products/optics/magnesium-fluoride-mgf2.html (Year: 1999).*
Aluminum, Al; www.matweb.com/search/DataSheet.aspx?MatGUID=0cd1edf33ac145ee93a0aa6fc666c0e0 (Year: 1996).*
International Search Report and Written Opinion for PCT/US2020/020200 dated Jun. 26, 2020.
Office Actioin from Taiwan Patent Application No. 109112160 dated Mar. 9, 2022.
Office Action from Japan Patent Application No. 2021-568493 dated Jan. 10, 2023.
Office Action from Chjinese Patent Application No. 202080037702.0 dated Feb. 18, 2023.
Office Action from Japan Patent Application No. 2021-568493 dated Jun. 27, 2023.
Korean Office Action dated Aug. 21, 2023 for Application No. 10-2021-7041759.
Chinese Office Action dated Aug. 5, 2023 for Application No. 202080037702.0.

* cited by examiner

SUBSTRATE SUPPORT COVER FOR HIGH-TEMPERATURE CORROSIVE ENVIRONMENT

CROSS-REFERENCE TO RELATED APPLICATIONS

This application claims priority to U.S. Provisional Patent Application Ser. No. 62/851,461, filed on May 22, 2019, which herein is incorporated by reference.

BACKGROUND

Field

Embodiments of the present disclosure generally relate to an apparatus and a method for cleaning a processing chamber.

Description of the Related Art

During a chemical vapor deposition (CVD) process, the reactant gases can create compositions which deposit upon the inside surfaces of the chamber. As these deposits build up, the residues can flake off and contaminate future processing steps. Such residue deposits can also adversely affect other processing conditions such as deposition uniformity, deposition rate, film stress, particle performance, and the like.

Accordingly, processing chambers are typically periodically cleaned to remove the residue material. The cleaning process typically involves a plasma enhanced dry cleaning technique. The etchant, typically a halogen or an oxygen containing gas, such as fluorine containing gas or oxygen gas, can react with the surface of the substrate support to form a fluoride or an oxide. In some applications, the substrate support is maintained at an elevated temperature, such as greater than 500 degrees Celsius. At the elevated temperature, the fluoride or oxide sublimates and condenses on chamber components that are at a lower temperature than the substrate support, for example the showerhead. The condensation can cause contamination of the substrates during CVD processes and can lead to changes in the CVD process conditions, such as deposition rate and uniformity drifting.

Conventionally, the substrate support is coated with a thin coating, such as an yttrium based coating, which is resistant to the cleaning gases. However, the coating may be scratched off as substrates are placed on and removed from the substrate support. Furthermore, it is expensive and difficult to coat a substrate support due to the size and components attached to the substrate support.

Therefore, an improved apparatus is needed.

SUMMARY

Embodiments of the present disclosure generally relate to an apparatus and a method for cleaning a processing chamber. In one embodiment, a processing chamber includes a chamber body, and a substrate support disposed in the chamber body. The substrate support includes a surface and a side surface connected to the surface. The processing chamber further includes a substrate support cover removably disposed on the substrate support. The substrate support cover includes a fluoride material and is exposed to a processing region in the processing chamber.

In another embodiment, a method includes removing a substrate from a processing chamber, and placing a substrate support cover on a substrate support disposed in the processing chamber. The substrate support cover includes a fluoride material. The method further includes performing a cleaning process in the processing chamber while the substrate support cover is on the substrate support, the fluoride material of the substrate support cover being exposed to a cleaning gas or cleaning species during the cleaning process.

In another embodiment, a substrate support cover includes a plate including a fluoride material. The substrate support cover further includes a side cover movably coupled to the plate, and the side cover extends through the plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an apparatus and a method for cleaning a processing chamber. In one embodiment, a substrate support cover includes a bulk member coated with a fluoride coating. The substrate support cover is placed on a substrate support disposed in the processing chamber during a cleaning process. The fluoride coating does not react with the cleaning species. The substrate support cover protects the substrate support from reacting with the cleaning species, leading to reduced condensation formed on chamber components, which in turn leads to reduced contamination of the substrate in subsequent processes and prevents changes or drifts of the processing conditions.

Figure 1:
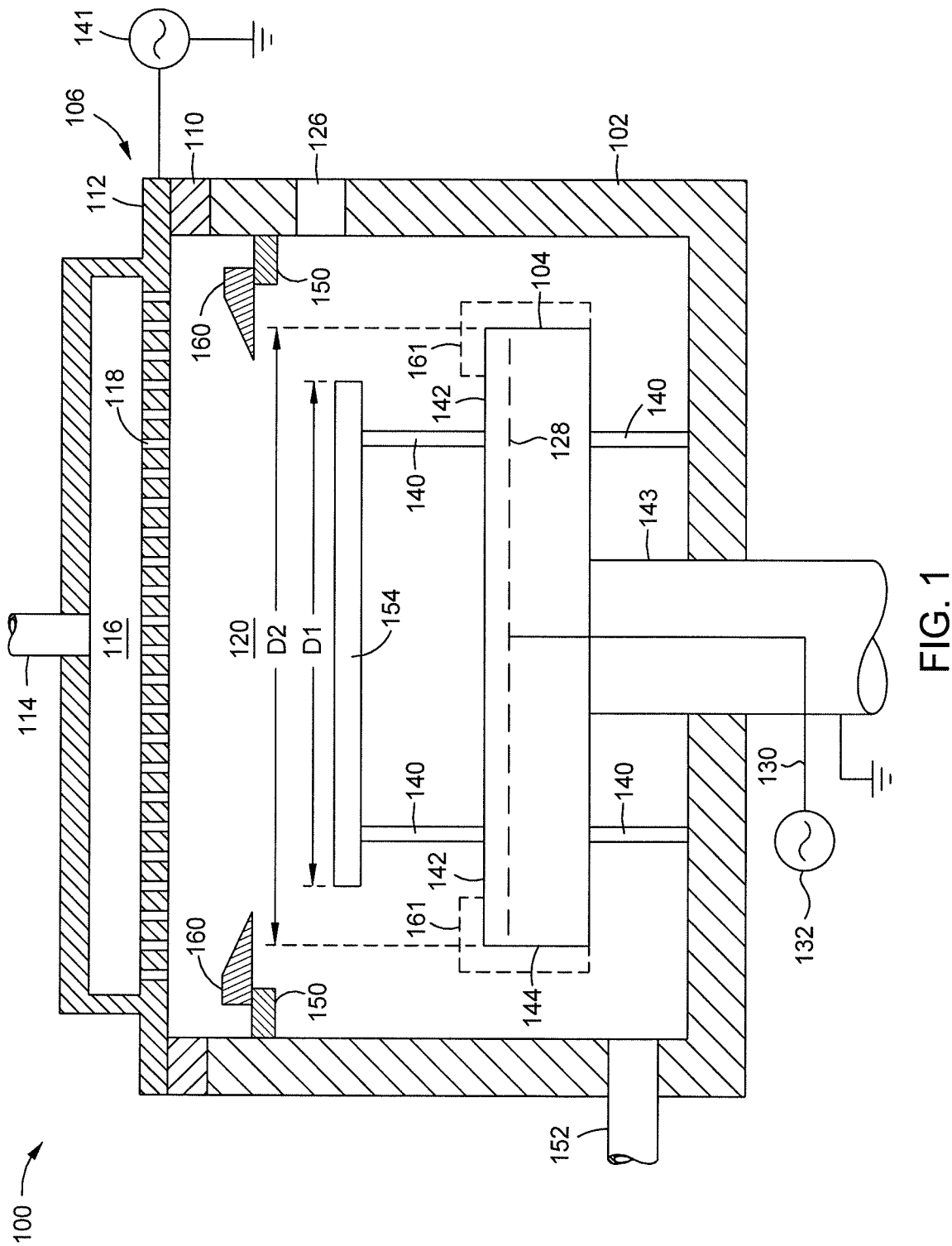
FIG. 1 is a schematic cross-sectional side view of a processing chamber.

FIG. 1 is a schematic cross-sectional view of a processing chamber 100 according to one embodiment described herein. The processing chamber 100 may be a plasma enhanced CVD (PECVD) chamber or other plasma enhanced processing chamber. An exemplary process chamber which may benefit from the embodiments described herein is the PRODUCER® series of PECVD enabled chambers, available from Applied Materials, Inc., Santa Clara, CA It is contemplated that other similarly equipped process chambers from other manufacturers may also benefit from the embodiments described herein. The processing chamber 100 includes a chamber body 102, a substrate support 104 disposed inside the chamber body 102, and a lid assembly 106 coupled to the chamber body 102 and enclosing the substrate support 104 in a processing region 120. The lid assembly 106 includes a gas distributor, such as a showerhead 112. Substrates 154 are provided to the processing region 120 through an opening 126 formed in the chamber body 102.

An isolator 110, which may be a dielectric material such as a ceramic or metal oxide, for example aluminum oxide and/or aluminum nitride, separates the showerhead 112 from the chamber body 102. The showerhead 112 includes openings 118 for admitting process gases or cleaning gases into the processing region 120. The gases may be supplied to the process chamber 100 via a conduit 114, and the gases may enter a gas mixing region 116 prior to flowing through the openings 118. An exhaust 152 is formed in the chamber body 102 at a location below the substrate support 104. The exhaust 152 may be connected to a vacuum pump (not shown) to remove unreacted species and by-products from the processing chamber 100.

The showerhead 112 may be coupled to an electric power source 141, such as an RF generator or a DC power source. The DC power source may supply continuous and/or pulsed DC power to the showerhead 112. The RF generator may supply continuous and/or pulsed RF power to the showerhead 112. The electric power source 141 is turned on during the operation to supply an electric power to the showerhead 112 to facilitate formation of a plasma in the processing region 120.

The substrate support 104 includes a surface 142 for supporting the substrate 154 and a side surface 144. The side surface 144 is non-coplanar with the surface 142. In one embodiment, the side surface 144 is substantially perpendicular to the surface 142. The substrate 154 has a dimension $D_1$, for example a diameter, and the substrate support 104 has a dimension $D_2$, for example a diameter, that is greater than the dimension $D_1$. The substrate support 104 may be formed from a ceramic material, for example a metal oxide or nitride or oxide/nitride mixture such as aluminum, aluminum oxide, aluminum nitride, or an aluminum oxide/nitride mixture. The substrate support 104 is supported by a shaft 143. The substrate support 104 may be grounded. A heating element 128 is embedded in the substrate support 104. The heating element 128 may be a plate, a perforated plate, a mesh, a wire screen, or any other distributed arrangement. The heating element 128 is coupled to a power source 132 via a connection 130. The heating element 128 can heat the substrate support to an elevated temperature, such as greater than 500 degrees Celsius.

The substrate support 104 shown in FIG. 1 is at a lower position, and the substrate 154 is supported by a plurality of lift pins 140 extending through the substrate support 104. The substrate 154 may be placed on the lift pins 140 or removed from the lift pins 140 by a robot (not shown) through the opening 126. During operation, the substrate support 104 raises to a higher position, and the substrate 154 is disposed on the surface 142. A ring 160 may be lifted by the substrate 154 or the substrate support 104, and the ring 160 may be disposed on the substrate support 104 surrounding the substrate 154 during operation. The ring 160 may be a shadow ring, which covers the edge portion of the substrate 154 during operation. The ring 160 is supported by a ledge 150 disposed on the chamber body 102 when the substrate support 104 is at the lower position, as shown in FIG. 1. In some embodiments, instead of using the ring 160, a side cover 161 is disposed on the substrate support 104 and stays on the substrate support 104 during both deposition and cleaning processes.

Figure 2A:
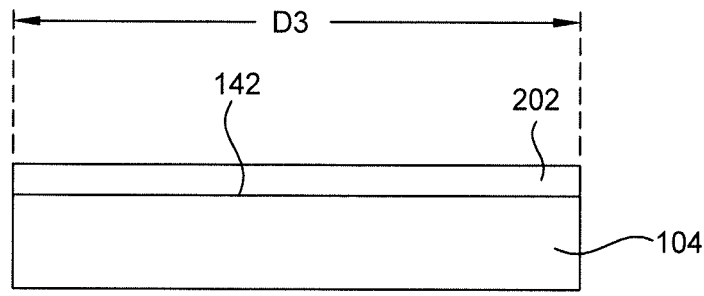
FIGS. 2A-2E are schematic side views of a substrate support having a substrate support cover disposed thereon.

FIGS. 2A-2E are schematic side views of the substrate support 104 having a substrate support cover 202 disposed thereon. The substrate support cover 202 is not a coating on the substrate support 104. Instead, the substrate support cover 202 is removably disposed on the substrate support 104. In other words, the substrate support cover 202 can be placed on and picked up from the substrate support 104. As shown in FIG. 2A, the substrate support cover 202 has a dimension $D_3$, for example a diameter, that is the same as the dimension $D_2$ of the substrate support 104. In other words, the substrate support cover 202 convers the entire surface 142 of the substrate support 104.

During a cleaning process, a cleaning gas, for example a fluorine containing gas or an oxygen containing gas, may react with the substrate support 104 to form a fluoride or an oxide on the substrate support 104. In some applications, the substrate support 104 is maintained at a temperature greater than 500 degrees Celsius. At such elevated temperate, the fluoride or oxide sublimates and condenses on cooler chamber components, such as the showerhead 112 (shown in FIG. 1). The condensation of materials on the showerhead 112 can cause contamination of the substrate during subsequent processes. Thus, the substrate support cover 202 is utilized. The method of using the substrate support cover 202 is described in FIG. 7.

The substrate support cover 202 may be fabricated from a fluoride material, such as magnesium fluoride ($MgF_2$), or rare earth fluoride, for example yttrium fluoride ($YF_3$) or lanthanum fluoride ($LaF_3$). The fluoride material of the substrate support cover 202 is exposed to the processing region 120. In some embodiments, the fluorides are doped with a dopant, such as boron and/or carbon. The dopant level ranges from about 0 percent to about 50 percent, such as from about 10 percent to about 30 percent. In one embodiment, the fluoride is boron and carbon doped $LaF_3$ ($LaF_3$(B,C)). The fluoride does not react with the cleaning gases, and the fluoride does not sublimate at elevated temperatures, such as greater than 500 degrees Celsius or greater than 1000 degrees Celsius. In one embodiment, the substrate support cover 202 is a single layer of $MgF_2$ or rare earth fluoride, such as $YF_3$, $LaF_3$, or $LaF_3$(B,C) having a thickness ranging from about 100 microns to about 3000 microns, such as from about 500 microns to about 1500 microns. The substrate support cover 202 may be fabricated using any suitable method, such as CVD, crystal growth, or sintering.

Figure 2B:
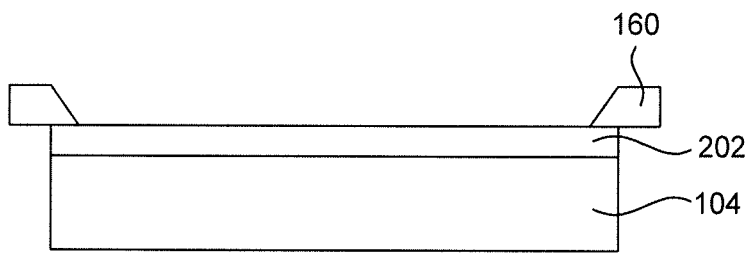

In some embodiments, the ring 160 is disposed on the substrate support cover 202 during the cleaning process, as shown in FIG. 2B. The ring 160 is being cleaned during the cleaning process. In some embodiments, instead of disposed on the substrate support cover 202, the ring 160 is disposed on the ledge 150 during the cleaning process.

Figure 2C:
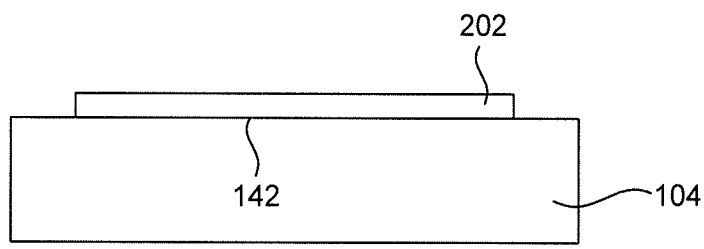
Figure 2D:
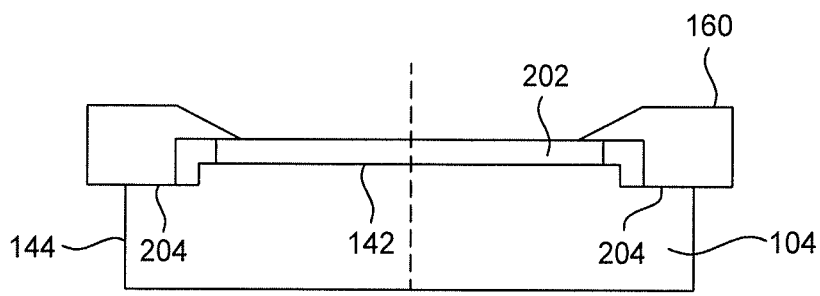
Figure 2E:
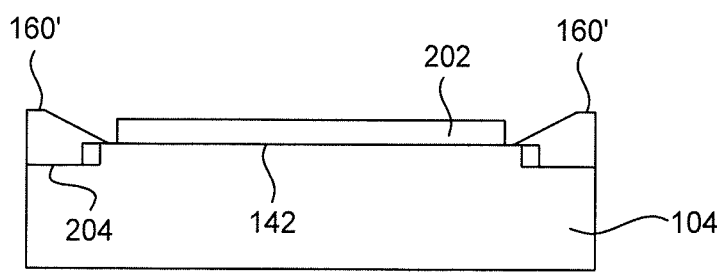

In some embodiments, the substrate support cover 202 has a dimension, such as a diameter, that is less than the dimension $D_2$ of the substrate support 104, as shown in FIG. 2C, or the same as the dimension $D_1$ of the substrate 154 (shown in FIG. 1). A portion of the surface 142 of the substrate support 104 may be exposed during the cleaning process. The ring 160 may be utilized to protect the exposed portion of the surface 142. As shown in FIG. 2D, the ring 160 is a shadow ring disposed on a surface 204 of the substrate support 104. The surface 204 is non-coplanar with the surface 142 of the substrate support 104. The ring 160 covers the edge portion of the substrate support cover 202. As shown in FIG. 2E, the ring 160' may be an edge ring that does not cover the edge portion of the substrate support cover 202. The ring 160' covers the edge portion of the surface 142 of the substrate support 104. Similar to the side cover 161 (shown in FIG. 1), the ring 160' is disposed on the substrate support 104 and stays on the substrate support 104 during both deposition and cleaning processes.

Figure 3A:
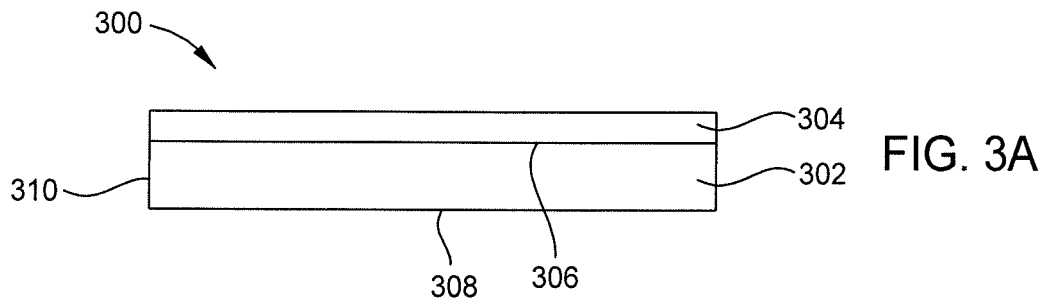
FIGS. 3A-3F are side views of a substrate support cover.

FIGS. 3A-3F are side views of a substrate support cover 300 according to other embodiments described herein. As shown in FIG. 3A, the substrate support cover 300 includes a bulk layer 302 and a coating layer 304. The bulk layer 302 includes a first surface 306 in contact with the coating layer 304, a second surface 308 opposite the first surface 306, and a third surface 310 connecting the first surface 306 and the second surface 308. The second surface 308 is in contact with the surface 142 of the substrate support 104 (shown in FIG. 2) during the cleaning process. The first surface 306 of the bulk layer 302 may be smooth, as shown in FIG. 3A.

The bulk layer 302 may be fabricated from silicon (Si), silicon dioxide ($SiO_2$), aluminum nitride (AlN), aluminum oxide (AlO), quartz, or other suitable material. The bulk layer 302 may be fabricated by any suitable method, such as sintering. The bulk layer 302 has a thickness ranging from about 100 microns to about 3000 microns, such as from about 500 microns to about 1500 microns. The coating layer 304 may be fabricated from the same material as the substrate support cover 202. The coating layer 304 may be fabricated from PVD, CVD, PECVD, ALD, ion assisted deposition (IAD), plasma spray, wet coating, implantation, or plasma or laser based surface fluorination, boronization, and/or carbidation. The coating layer 304 has a thickness ranging from about 1000 Angstroms to about 10 microns, such as from about 5000 Angstroms to about 1 micron. The coating layer 304 is exposed to the processing region 120 (shown in FIG. 1).

Figure 3B:
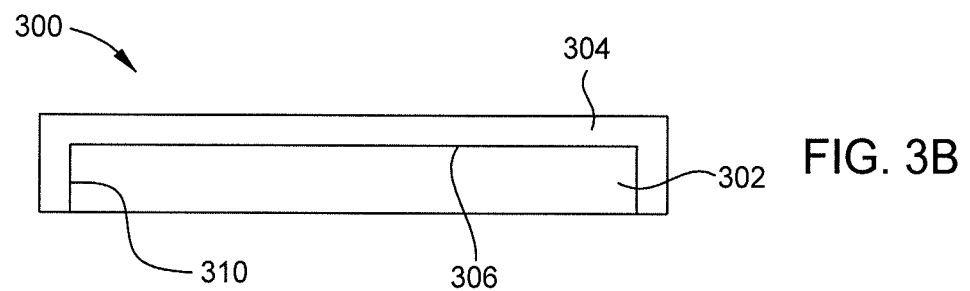
Figure 3C:
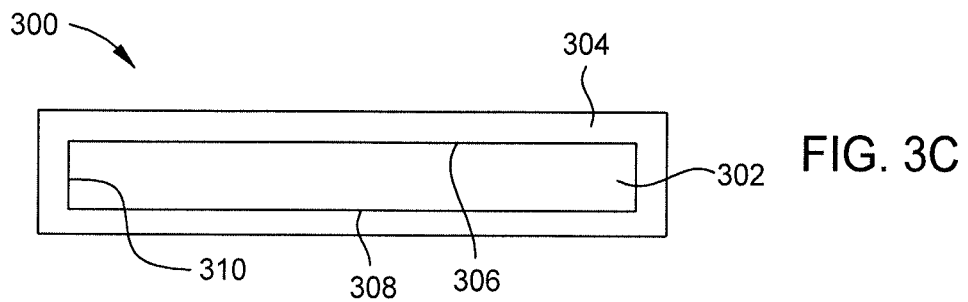

As shown in FIG. 3B, the substrate support cover 300 includes the bulk layer 302 and the coating layer 304 that covers the first surface 306 and the third surface 310 of the bulk layer 302. As shown in FIG. 3C, the substrate support cover 300 includes the bulk layer 302 and the coating layer 304 that covers the first surface 306, the second surface 308, and the third surface 310 of the bulk layer 302.

Figure 3D:
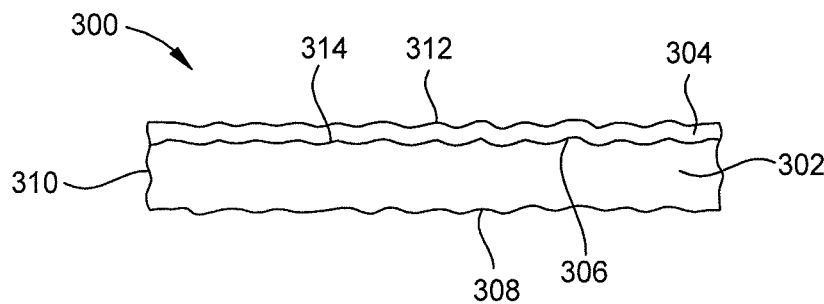

FIGS. 3A-3C illustrate the bulk layer 302 having smooth surfaces. In other embodiments, one or more surfaces of the bulk layer 302 may be textured to prevent peeling of the coating layer 304 from the bulk layer 302. As shown in FIG. 3D, the substrate support cover 300 includes the bulk layer 302 having a textured first surface 306 and the coating layer 304 disposed on the first surface 306. The bulk layer 302 further includes the textured second surface 308 and textured third surface 310. The coating layer 304 includes a first surface 314 in contact with the first surface 306 of the bulk layer 302 and a second surface 312 opposite the first surface 314. The second surface 312 of the coating layer 304 may be textured as the result of the textured first surface 306 of the bulk layer 302.

Figure 3E:
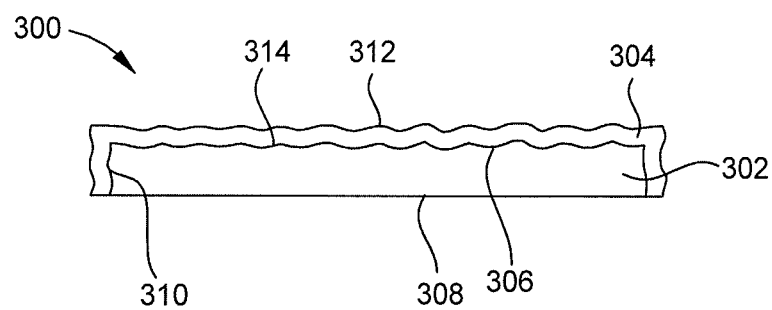

As shown in FIG. 3E, the substrate support cover 300 includes the bulk layer 302 having textured first surface 306, the second surface 308, and textured third surface 310. The coating layer 304 is disposed on the first surface 306 and the third surface 310. The first surface 314 of the coating layer 304 is in contact with the textured first surface 306 and the textured third surface 310 of the bulk layer 302, and the second surface 312 is opposite the first surface 314. The second surface 312 may be textured as the result of the textured first surface 306 and the textured third surface 310 of the bulk layer 302. The first surface 314 may also be textured as the result of the textured first surface 306 and the textured third surface 310.

Figure 3F:
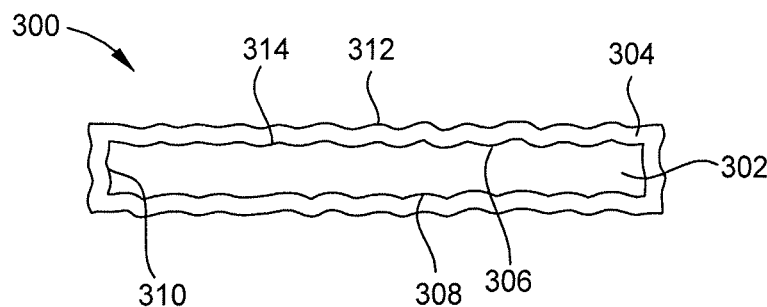

As shown in FIG. 3F, the substrate support cover 300 includes the bulk layer 302 having the textured first surface 306, textured second surface 308, and textured third surface 310. The coating layer 304 is disposed on the first surface 306, second surface 308, and the third surface 310. The first surface 314 of the coating layer 304 is in contact with the textured first surface 306, textured second surface 308, and the textured third surface 310 of the bulk layer 302, and the second surface 312 is opposite the first surface 314. The second surface 312 may be textured as the result of the textured first surface 306, textured second surface 308, and the textured third surface 310 of the bulk layer 302. The substrate support cover 300 as shown in FIGS. 3A-3F may replace the substrate support cover 202 (shown in FIGS. 2A and 2C) to protect the substrate support 104 (shown in FIG. 2A or 2D) in a cleaning process.

Figure 4A:
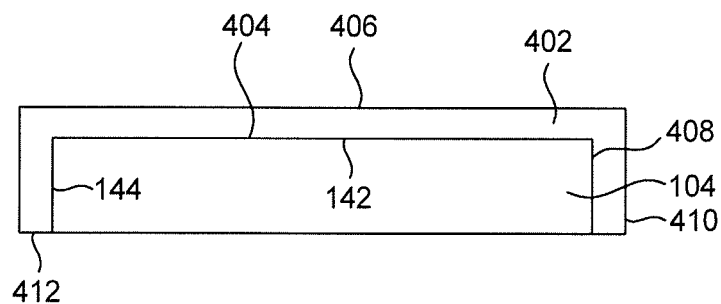
FIGS. 4A-4C are schematic side views of the substrate support having a substrate support cover disposed thereon.
Figure 4B:
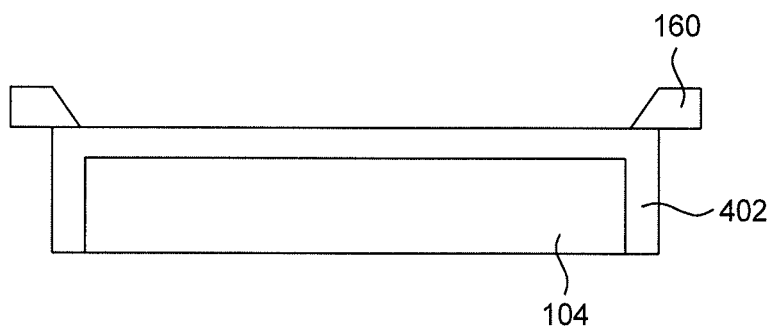
Figure 4C:
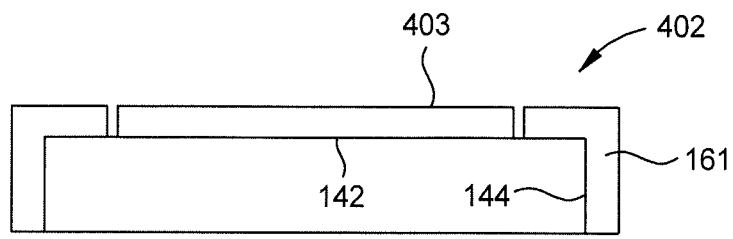

FIGS. 4A-4C are schematic side views of the substrate support 104 having a substrate support cover 402 disposed thereon. The substrate support cover 402 is not a coating on the substrate support 104. Instead, the substrate support cover 402 is removably disposed on the substrate support 104. In other words, the substrate support cover 402 can be placed on and picked up from the substrate support 104. As shown in FIG. 4A, the substrate support cover 402 covers the surface 142 and the side surface 144 of the substrate support 104. The substrate support cover 402 includes a first surface 404 in contact with the surface 142 of the substrate support 104, a second surface 406 opposite the first surface 404, a third surface 408 extending from the first surface 404 and facing the side surface 144 of the substrate support 104, a fourth surface 410 extending from the second surface 406 and opposite the third surface 408, and a fifth surface 412 connecting the third surface 408 and the fourth surface 410. In some embodiments, the third surface 408 and the fourth surface 410 are substantially perpendicular to the first surface 404 and the second surface 406. In one embodiment, the first surface 404 and the second surface 406 are circular, the third surface 408 and the fourth surface 410 are cylindrical, and the fifth surface 412 is annular. The substrate support cover 402 may be fabricated from the same material as the substrate support cover 202. The substrate support cover 402 may be fabricated by the same method as the substrate support cover 202. The substrate support cover 402 is exposed to the processing region 120 (shown in FIG. 1).

In some embodiments, the ring 160 is disposed on the substrate support cover 402 during the cleaning process, as shown in FIG. 4B. The ring 160 is being cleaned during the cleaning process. In some embodiments, instead of disposed on the substrate support cover 202, the ring 160 is disposed on the ledge 150 during the cleaning process. The ring 160 may include a coating that is the same as the coating layer 304 of the substrate support cover 300. The ring 160 may be a shadow ring.

In some embodiments, the substrate support cover 402 includes a plate 403 and the side cover 161, as shown in FIG. 4C. The plate 403 may be the substrate support cover 202. The plate 403 covers the center portion of the surface 142 and the side cover 161 covers the edge portion of the surface 142 and the side surface 144. The side cover 161 may remain in the processing chamber, such as the processing chamber 100, during processing of substrates 154 (shown in FIG. 1). The side cover 161 may be fabricated from the same material as the substrate support cover 202 or substrate support cover 300.

Figure 5A:
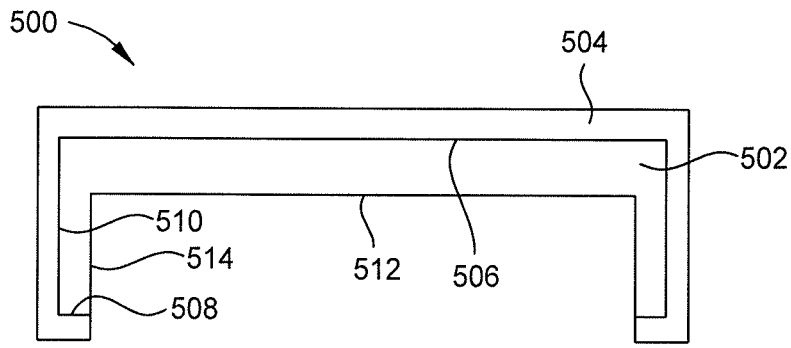
FIGS. 5A-5D are side views of a substrate support cover.

FIGS. 5A-5D are side views of a substrate support cover 500 according to other embodiments described herein. As shown in FIG. 5A, the substrate support cover 500 includes a bulk layer 502 and a coating layer 504. The bulk layer 502 includes a first surface 512, a second surface 506 opposite the first surface 512, a third surface 514 extending from the first surface 512, a fourth surface 510 extending from the second surface 506 and opposite the third surface 514, and a fifth surface 508 connecting the third surface 514 and the fourth surface 510. In some embodiments, the third surface 514 and the fourth surface 510 are substantially perpendicular to the first surface 512 and the second surface 506. In one embodiment, the first surface 512 and the second surface 506 are circular, the third surface 514 and the fourth surface 510 are cylindrical, and the fifth surface 508 is annular. The first surface 512 may be in contact with the surface 142 and the third surface 514 may face the side surface 144 of the substrate support 104 (FIG. 2A), when the substrate support cover 500 is placed on the substrate support 104 during a cleaning process. The bulk layer 502 may be fabricated from the same material as the bulk layer 302. The coating layer 504 is disposed on and in contact with the second surface 506, the fourth surface 510, and the fifth surface 508 of the bulk layer 502. The coating layer 504 may be fabricated from the same material as the coating layer 304. The coating layer 504 may be fabricated by the same method as the coating layer 304. The coating layer 504 is exposed to the processing region 120 (shown in FIG. 1).

Figure 5B:
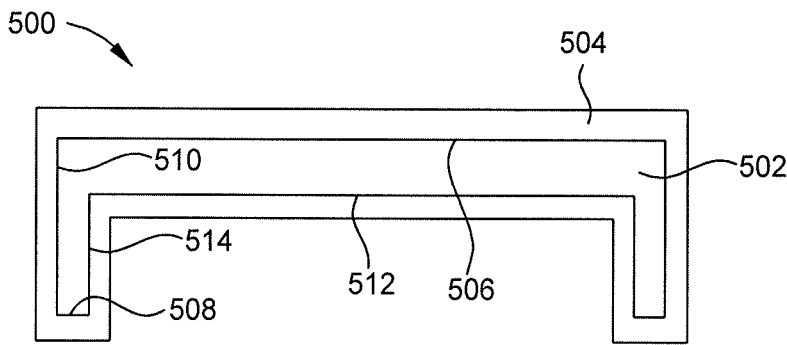

As shown in FIG. 5B, the substrate support cover 500 includes the bulk layer 502 and the coating layer 504. Surfaces 506, 508, 510, 512, 514 of the bulk layer 502 are covered by and in contact with the coating layer 504. The portion of the coating layer 504 that is in contact with the first surface 512 of the bulk layer 502 may be in contact with the surface 142 and the third surface 514 may face the side surface 144 of the substrate support 104 (FIG. 2A), when the substrate support cover 500 is placed on the substrate support 104 during a cleaning process.

Figure 5C:
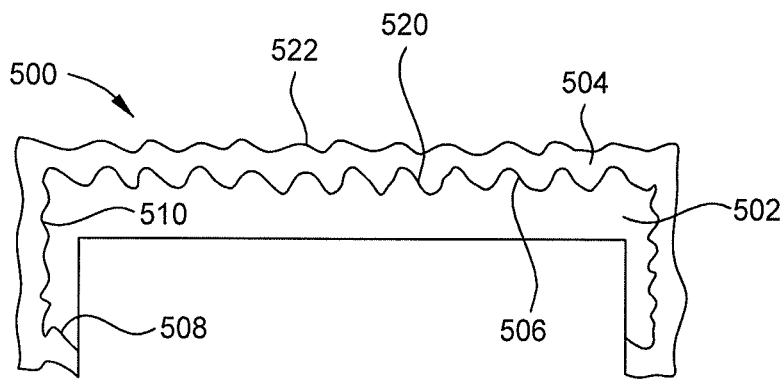

FIGS. 5A-5B illustrate the bulk layer 502 having smooth surfaces. In other embodiments, one or more surfaces of the bulk layer 502 may be textured to prevent peeling of the coating layer 504 from the bulk layer 502. As shown in FIG. 5C, the substrate support cover 500 includes the bulk layer 502 having a textured second surface 506, textured fourth surface 510, and textured fifth surface 508. The coating layer 504 disposed on the textured second surface 506, textured fourth surface 510, and textured fifth surface 508. The coating layer 504 includes a first surface 520 in contact with the second surface 506, the fourth surface 510, and the fifth surface 508 of the bulk layer 502 and a second surface 522 opposite the first surface 520. The second surface 522 of the coating layer 504 may be textured as the result of the textured second surface 506, textured fourth surface 510, and textured fifth surface 508 of the bulk layer 502.

Figure 5D:
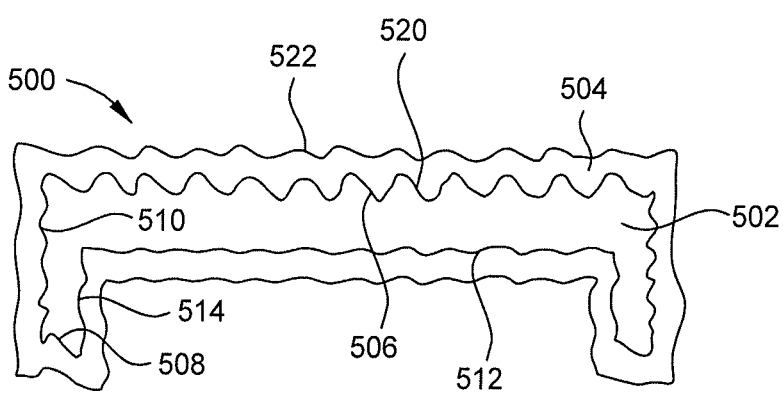

As shown in FIG. 5D, the substrate support cover 500 includes the bulk layer 502 having textured first surface 512, textured second surface 506, textured third surface 514, textured fourth surface 510, and textured fifth surface 508. The coating layer 504 is disposed on the surfaces 506, 508, 510, 512, 514. The first surface 520 of the coating layer 504 is in contact with the textured surfaces 506, 508, 510, 512, 514 of the bulk layer 502, and the second surface 522 is opposite the first surface 520. The second surface 522 may be textured as the result of the textured surfaces 506, 508, 510, 512, 514 of the bulk layer 302. The substrate support cover 500 as shown in FIGS. 5A-5D may replace the substrate support cover 402 (shown in FIG. 4A) to protect the substrate support 104 (shown in FIG. 2A) in a cleaning process.

Figure 6A:
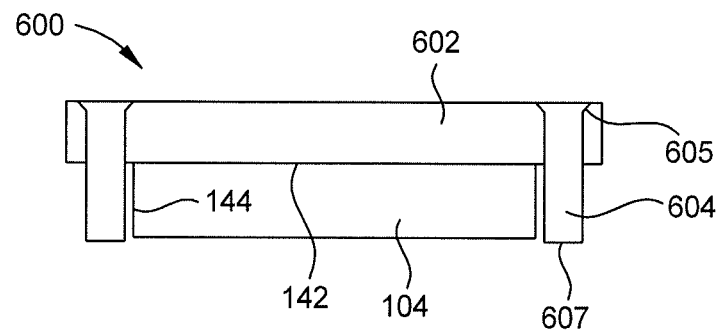
FIGS. 6A-6C are various views of a substrate support cover.
Figure 6B:
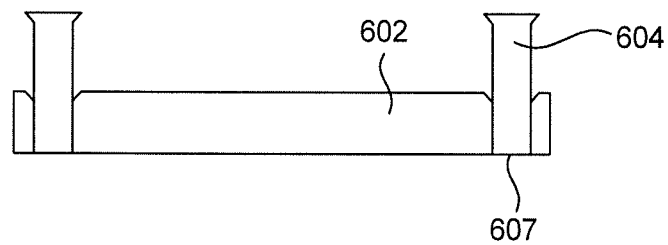
Figure 6C:
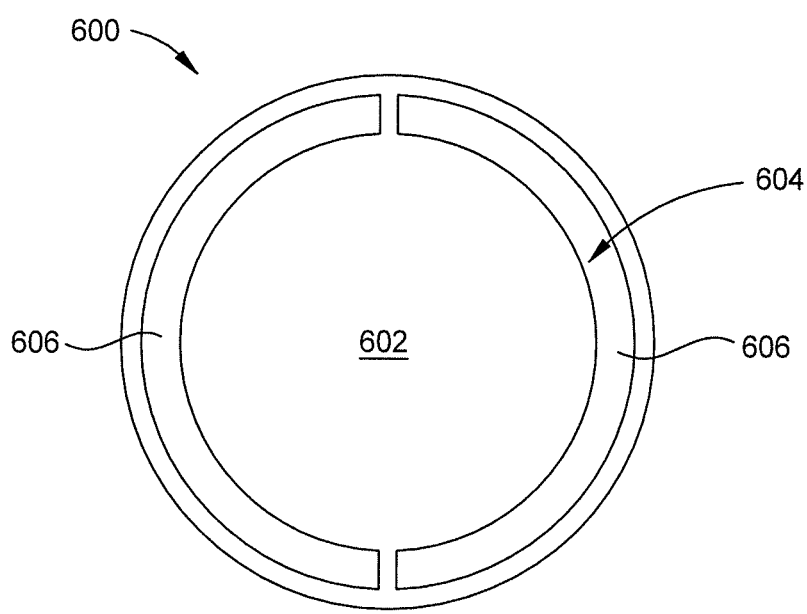

FIGS. 6A-6C are various views of a substrate support cover 600 according to another embodiment. As shown in FIG. 6A, the substrate support cover 600 is disposed on the substrate support 104 during a cleaning process in a processing chamber, such as the processing chamber 100 (shown in FIG. 1). The substrate support cover 600 includes a plate 602 covering the surface 142 of the substrate support 104 and side cover 604 covering the side surface 144 of the substrate support 104. The side cover 604 is coupled to the plate 602 and is movable relative to the plate 602. The side cover 604 includes a top portion 605 having a larger dimension than the remaining portion of the side cover 604. The side cover 604 extends through the plate 602. During the cleaning process, the plate 602 of the substrate support cover 600 is disposed on the surface 142 of the substrate support 104, and the side cover 604 drops down due to gravity to protect the side surface 144 of the substrate support 104. The top portion 605 prevents the side cover 604 from extending through the plate 602. The plate 602 and the side cover 604 each may be fabricated from the same material as the substrate support cover 202 or substrate support cover 300.

During the handling of the substrate support cover 600, the robot (not shown) engages a surface 607 of the side cover 604 opposite the top portion 605. The side cover 604 moves up, so that the surface 607 is at the same level as the bottom surface of the plate 602, as shown in FIG. 6B. FIG. 6C is a top view of the substrate support cover 600. As shown in FIG. 6C, the side cover 604 includes two or more segments 606. Multiple segments 606 enable that the side cover 604 is movable relative to the plate 602.

Figure 7:
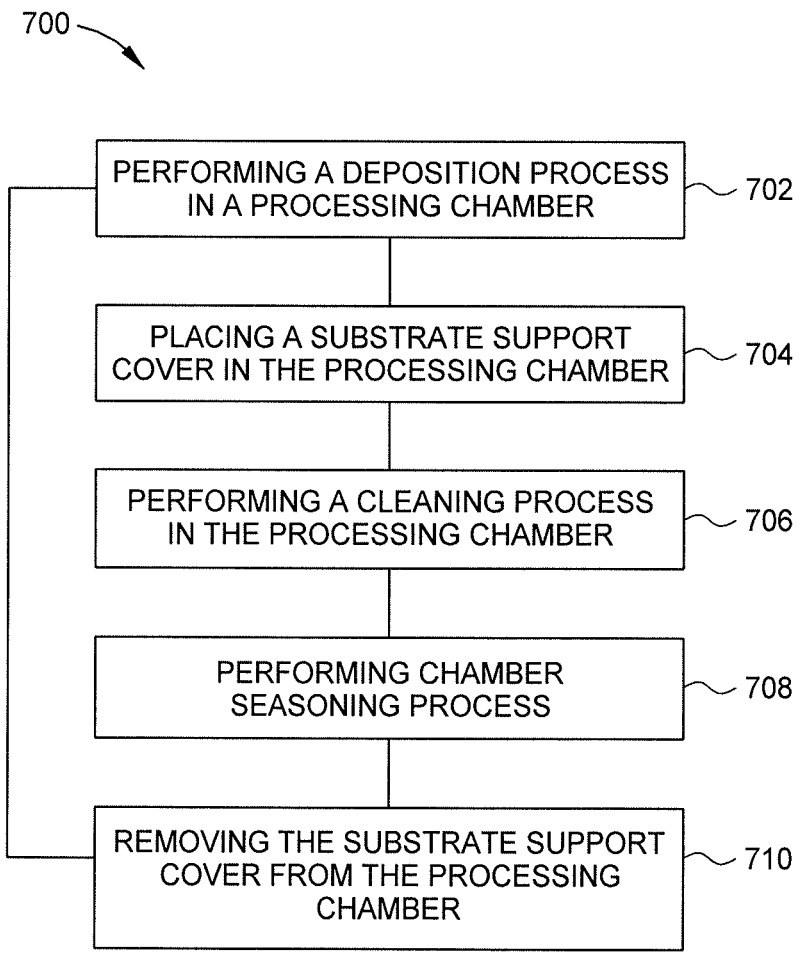
FIG. 7 is a flow chart showing a method for operating the processing chamber of FIG. 1.

FIG. 7 is a flow chart showing a method 700 for operating the processing chamber of FIG. 1. The method 700 starts at operation 702, which is to perform a deposition process in the processing chamber, such as the processing chamber 100 (shown in FIG. 1). The deposition process includes placing a substrate, such as the substrate 154 (shown in FIG. 1) into the processing chamber, depositing a layer, such as a dielectric layer, on the substrate, and removing the substrate from the processing chamber. At operation 704, a substrate support cover is placed on a substrate support in a processing chamber. The substrate support cover may be the substrate support cover 202, 300, 402, 500, or 600, and the substrate support may be the substrate support 104. The substrate support cover is transferred into the processing chamber by a robot and is placed on the lift pins, such as the lift pins 140 (shown in FIG. 1). The substrate support is then raised to be in contact with the substrate support cover and to raise the substrate support cover to a cleaning position. In some embodiments, a ring, such as the ring 160, may be lifted by the substrate support or the substrate support cover, as the substrate support is raised to the cleaning position.

The substrate support may be maintained at the same temperature as the processing temperature during the deposition process performed at operation 702. In one embodiment, the substrate support is maintained at an elevated temperature, such as a greater than 500 degrees Celsius or greater than 1000 degrees Celsius. In another embodiment, the substrate support is maintained at a temperature greater than or equal to 20 degrees Celsius. In one embodiment, the deposition process at operation 702 is performed with the substrate support at a first temperature, and the temperature of the substrate support is maintained at the first temperature as the substrate support cover is placed thereon at operation 704.

Next, at operation 706, a cleaning process is performed in the processing chamber. The cleaning process may include flowing a cleaning gas, such as a fluorine containing gas or an oxygen containing gas, into the processing chamber. In some embodiments, the cleaning gas is first flowed into a remote plasma source disposed over the processing chamber, and cleaning species, such as radicals, are formed in the remote plasma source. The cleaning species is then flowed into the processing chamber to perform the cleaning process. The cleaning gas or cleaning species removes any residue material built up on chamber components, such as the showerhead, edge or shadow ring, such as the ring 160 or 160' (shown in FIG. 1), side cover 161 (shown in FIG. 1), and/or chamber wall. However, the cleaning gas or cleaning species does not react with the substrate support cover, and the substrate support is protected from the cleaning gas or cleaning species by the substrate support cover.

Next, at operation 708, an optional chamber seasoning process is performed to season the components of the processing chamber in order to improve process stability and reduce periodic chamber maintenance. At operation 710, the substrate support cover is removed from the substrate support. After the cleaning process or the optional seasoning process, the substrate support drops to the lower position, and the substrate support cover is supported by the lift pins and is picked up and moved, out of the processing chamber by a robot. In some embodiments, the operation 708 is performed after operation 710. After operation 710, another cycle of operations 702, 704, 706, 708 are performed.

The substrate support cover fabricated from a fluoride material is utilized to protect the substrate support during a cleaning process. The fluoride based substrate support cover does not react with the cleaning gas or cleaning species, and no product is formed that can be sublimated as the substrate support is maintained at an elevated temperature.

While the foregoing is directed to embodiments of the present disclosure, other and further embodiments of the disclosure may be devised without departing from the basic scope thereof.

What is claimed is:

1. A processing chamber, comprising:
   a chamber body;
   a substrate support disposed in the chamber body, the substrate support comprising a surface and a side surface connected to the surface; and
   a substrate support cover removably disposed on the substrate support and configured to be picked up from the substrate support by a substrate transfer robot, the substrate support cover comprising;
   a bulk material layer: and
   a coating of a fluoride material, wherein the coating is exposed to a processing region in the processing chamber;
   wherein the bulk layer further comprises a first surface in contact with the surface of the substrate support, a second surface opposite the first surface, a third surface extending from the first surface and facing the side surface of the substrate support, a fourth surface extending from the second surface and opposite the third surface, and a fifth surface connecting the third surface and the fourth surface.

2. The processing chamber of claim 1, wherein the fluoride material comprises magnesium fluoride or a rare earth fluoride.

3. The processing chamber of claim 2, wherein the rare earth fluoride comprises yttrium fluoride, or lanthanum fluoride.

4. The processing chamber of claim 3, wherein the lanthanum fluoride is doped with boron and/or carbon.

5. The processing chamber of claim 1, wherein the coating layer is disposed on at least one of the first, second, third, fourth, and fifth surfaces of the bulk layer.

6. The processing chamber of claim 1, wherein the bulk layer comprises silicon, silicon dioxide, aluminum nitride, aluminum oxide, or quartz, and the fluoride material comprises magnesium fluoride or a rare earth fluoride.

7. The processing chamber of claim 6, wherein the rare earth fluoride comprises yttrium fluoride, or lanthanum fluoride.

8. The processing chamber of claim 7, wherein the lanthanum fluoride is doped with boron and/or carbon.

9. A method, comprising:
   removing a substrate from a processing chamber;
   placing by a substrate transfer robot a substrate support cover on a substrate support disposed in the processing chamber, the substrate support cover comprises a bulk material layer, and a coating of a fluoride material, wherein the coating is exposed to a processing region in the processing chamber, wherein the bulk layer further comprises a first surface in contact with the surface of the substrate support, a second surface opposite the first surface, a third surface extending from the first surface and facing the side surface of the substrate support, a fourth surface extending from the second surface and opposite the third surface, and a fifth surface connecting the third surface and the fourth surface,
   performing a cleaning process in the processing chamber while the substrate support cover is on the substrate support, the fluoride material of the substrate support cover being exposed to a cleaning gas or cleaning species during the cleaning process.

10. The method of claim 9, further comprising performing a seasoning process in the processing chamber after the cleaning process, wherein the seasoning process is performed with the substrate support cover disposed on the substrate support.

* * * * *